US012791494B2

(12) United States Patent
Yim et al.

(10) Patent No.: US 12,791,494 B2
(45) Date of Patent: Nov. 10, 2026

(54) APPARATUS FOR ANALYZING IMAGE AND OPERATION METHOD THEREOF

(71) Applicant: Samsung Electronics Co., Ltd., Suwon-si (KR)

(72) Inventors: Yeny Yim, Suwon-si (KR); Dongok Kim, Suwon-si (KR); Won-Hee Lee, Suwon-si (KR); Byeongseon Choi, Suwon-si (KR); Eunjin Choi, Suwon-si (KR); Han-Saem Park, Suwon-si (KR); Sang-Min Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 152 days.

(21) Appl. No.: 18/979,810

(22) Filed: Dec. 13, 2024

(65) Prior Publication Data

US 2025/0347633 A1 Nov. 13, 2025

(30) Foreign Application Priority Data

May 7, 2024 (KR) ........................ 10-2024-0059864

(51) Int. Cl.
*G01N 21/95* (2006.01)
*G01N 21/17* (2006.01)
(Continued)

(52) U.S. Cl.
CPC ..... *G01N 21/9501* (2013.01); *G01N 21/1717* (2013.01); *G01N 21/8851* (2013.01);
(Continued)

(58) Field of Classification Search
CPC ........... G01N 21/9501; G01N 21/1717; G01N 21/8851; G01N 2021/8861;
(Continued)

(56) References Cited

U.S. PATENT DOCUMENTS 7,570,796 B2 8/2009 Zafar et al.
7,676,077 B2 3/2010 Kulkarni et al.
(Continued)

OTHER PUBLICATIONS

Irwin Sobel et al., A 3x3 isotropic gradient operator for image processing, Research Gate, Jan. 1973, 1-5.

*Primary Examiner* — Michael S Osinski
(74) *Attorney, Agent, or Firm* — Muir Patent Law, PLLC

(57) ABSTRACT

Apparatus for analyzing images includes a memory and a processor, and the processor is configured to, by executing the at least one instruction stored in the memory, detect an image coordinate of a defect position in a defect reaction image acquired by imaging a semiconductor device, generate a golden image of the semiconductor device based on a plurality of pattern images acquired by imaging a plurality of semiconductor devices, generate a design layout image corresponding to the pattern image based on a design layout of the plurality of semiconductor devices, generate relationship information between a pattern image and the design layout image based on the pattern image, the golden image, and the design layout image, and extract a design layout image coordinate corresponding to the defect position from the design layout image using the image coordinate of the defect position in the defect reaction image and the generated relationship information.

20 Claims, 11 Drawing Sheets

(51) Int. Cl.
*G01N 21/88* (2006.01)
*H10P 74/20* (2026.01)

(52) U.S. Cl.
CPC ................ *G01N 2021/8861* (2013.01); *G01N 2201/123* (2013.01); *G01N 2201/12746* (2013.01); *H10P 74/203* (2026.01)

(58) Field of Classification Search
CPC ... G01N 2201/123; G01N 2201/12746; G01N 21/95607; G01N 21/9505; H10P 74/203; G06T 2207/10061; G06T 7/001; G06T 2207/30148; G06T 7/0004; G06T 3/18; G06T 5/70; G06T 7/13; G06T 7/73; G06T 2207/20081; G06T 2207/20084; G06T 7/0006; G06T 2207/20016; G06T 2207/20021; G06T 2207/30168; G06T 7/0008; G06V 10/14
See application file for complete search history.

(56) References Cited

U.S. PATENT DOCUMENTS

| | | | | |
|---|---|---|---|---|
| 7,756,658 | B2 | 7/2010 | Kulkarni et al. | |
| 7,904,845 | B2 | 3/2011 | Fouquet et al. | |
| 8,229,205 | B2 | 7/2012 | Hyon et al. | |
| 8,750,597 | B2 | 6/2014 | Patterson et al. | |
| 8,953,868 | B2 * | 2/2015 | Murakami | G06T 7/001 382/141 |
| 9,087,367 | B2 | 7/2015 | Chang et al. | |
| 10,325,361 | B2 | 6/2019 | Bhattacharyya | |
| 10,648,924 | B2 | 5/2020 | Zhang et al. | |
| 10,802,073 | B2 * | 10/2020 | Shimoda | G01N 21/9505 |
| 11,386,549 | B2 * | 7/2022 | Miyazawa | G01N 21/88 |
| 12,675,872 | B2 * | 7/2026 | Lee | G06T 7/001 |
| 2007/0031026 | A1 * | 2/2007 | Kurihara | H01J 37/28 382/149 |
| 2009/0231424 | A1 * | 9/2009 | Honda | G06T 7/0006 348/87 |
| 2011/0077877 | A1 * | 3/2011 | Nikaido | G01R 31/307 324/501 |
| 2011/0274342 | A1 * | 11/2011 | Maeda | G01N 21/95623 382/149 |
| 2011/0285839 | A1 * | 11/2011 | Kotaki | G06T 7/001 348/80 |
| 2017/0076435 | A1 * | 3/2017 | Park | G01N 21/8851 |
| 2018/0005367 | A1 * | 1/2018 | Perali | G06T 7/0006 |
| 2019/0180430 | A1 * | 6/2019 | Lin | G06T 7/001 |
| 2021/0063319 | A1 * | 3/2021 | Chen | G01N 21/9505 |
| 2021/0065344 | A1 * | 3/2021 | Hirai | G06T 7/001 |
| 2021/0295485 | A1 * | 9/2021 | Miyazawa | G01N 21/8851 |
| 2022/0084856 | A1 * | 3/2022 | Hiroi | G01N 21/9501 |
| 2022/0292317 | A1 * | 9/2022 | Hirai | G06F 18/241 |
| 2022/0292659 | A1 * | 9/2022 | Liu | G06T 7/001 |
| 2022/0301136 | A1 * | 9/2022 | Hiroi | G06T 7/001 |
| 2022/0405905 | A1 * | 12/2022 | Doi | G06T 7/0004 |
| 2023/0103349 | A1 * | 4/2023 | Park | G01N 21/9501 382/149 |
| 2023/0326870 | A1 * | 10/2023 | Hamada | G01B 11/00 257/797 |
| 2024/0161271 | A1 * | 5/2024 | Okazaki | G06V 10/25 |
| 2024/0193755 | A1 * | 6/2024 | Choi | G06T 7/001 |
| 2024/0193760 | A1 * | 6/2024 | Fukuda | G06N 3/04 |
| 2024/0255439 | A1 * | 8/2024 | Han | G01N 21/31 |
| 2025/0027886 | A1 * | 1/2025 | Chiu | G01N 21/95607 |
| 2026/0111726 | A1 * | 4/2026 | Tao | G03F 7/706841 |

* cited by examiner

APPARATUS FOR ANALYZING IMAGE AND OPERATION METHOD THEREOF

CROSS-REFERENCE TO RELATED APPLICATION(S)

This application claims the benefit of Korean Patent Application No. 10-2024-0059864, filed on May 7, 2024, in the Korean Intellectual Property Office, the disclosure of which is incorporated herein by reference.

BACKGROUND

1. Field of the Invention

The present disclosure relates to an apparatus for analyzing an image and a method of operation thereof.

2. Description of the Related Art

A semiconductor is manufactured through various processes. With development of designing technology for the semiconductor, the number of processes for manufacturing the semiconductor is increased, and complexity of each process is also increased. Accordingly, various faults may occur in a manufacturing process of the semiconductor. Since such faults may have a critical effect on a semiconductor apparatus later, detecting faults of the semiconductor becomes greatly important.

In order to detect a semiconductor fault, an optical fault isolation (OFI) analysis technique for finding a cause of an element fault with a variety of optical technology is used as one of electrical fault analysis methods. An OFI equipment is a nondestructive analysis equipment for identifying a position of an electrical fault of an element by detecting an optical signal that occurs with an electrical signal applied to the element. For example, when a worker sets a central position of the element, the OFI equipment outputs a coordinate corresponding to the position of the electrical fault. However, accuracy of fault detection may be low because a fault coordinate that is output from the OFI equipment is greatly different from an actual fault coordinate by an error of up to 50 micrometers (μm).

There is also a method in which the worker directly compares a pattern image acquired from an optical imaging device such as the OFI equipment with a process design layout of a product and acquires a coordinate, of a fault in a defect reaction image having a coordinate system identical to the pattern image, on the process design layout is also used. However, a fault coordinate detection time for one semiconductor device is relatively long and may be ten minutes on average. In addition, the accuracy may differ for each worker.

SUMMARY

An aspect of embodiments of the inventive concept provides an apparatus for analyzing an image, which may automatically extract a fault coordinate of a process design layout of a product within a small margin of error, and a method of operation thereof.

The technical benefits achieved by example embodiments of the present disclosure are not limited to the objectives described above and other benefits may be inferred from the following example embodiments.

According to an aspect, there is provided an apparatus for analyzing an image, the apparatus including a memory in which at least one instruction is stored, and a processor operatively connected to the memory, and the processor is configured to, by executing the at least one instruction, detect an image coordinate of a defect position in a defect reaction image acquired by imaging a semiconductor device, generate a golden image of the semiconductor device based on a plurality of pattern images acquired by imaging a plurality of semiconductor devices, generate a design layout image corresponding to the plurality of pattern images based on a design layout of the plurality of semiconductor devices, generate relationship information between a pattern image and the design layout image based on the pattern image, the golden image, and the design layout image, and extract a design layout image coordinate corresponding to the defect position from the design layout image using the image coordinate of the defect position in the defect reaction image and the generated relationship information.

According to another aspect, there is provided a method for analyzing an image, the method including detecting an image coordinate of a defect position in a defect reaction image acquired by imaging a semiconductor device, generating a golden image of the semiconductor device based on a pattern image acquired by imaging the semiconductor device, generating a design layout image corresponding to the pattern image based on a process design layout of the semiconductor device, generating relationship information between the pattern image and the design layout image based on the pattern image, the golden image, and the design layout image, and extracting a design layout image coordinate corresponding to the defect position from the design layout image using the image coordinate of the defect position and the generated relationship information.

According to still another aspect, there is provided a system for analyzing an image, the system including an image acquisition apparatus configured to acquire a defect reaction image and a plurality of pattern images by optically imaging a plurality of semiconductor devices, and an apparatus for analyzing an image, which is configured to acquire the defect reaction image and the plurality of pattern images from the image acquisition apparatus, detect an image coordinate of a defect position in a defect reaction image, generate a golden image of the semiconductor device based on the pattern image, generate a design layout image corresponding to the pattern image based on a design layout of the semiconductor device, generate relationship information between the pattern image and the design layout image based on the pattern image, the golden image, and the design layout image, and extract a design layout image coordinate corresponding to the defect position from the design layout image using the image coordinate of the defect position and the generated relationship information.

Additional aspects of example embodiments will be set forth in part in the description which follows and, in part, will be apparent from the description, or may be learned by practice of the disclosure.

According to proposed example embodiments, one or more of the following effects may be expected.

According to example embodiments, it is possible to automatically extract, based on a defect reaction image and a pattern image that are acquired from an image acquisition device, a fault coordinate on the defect reaction image and a fault coordinate on a design layout corresponding thereto. Accordingly, since it is possible to minimize intervention of a worker in fault detection, a time required for the fault detection may be shortened, and an analysis amount may be increased.

Also, according to example embodiments, it is possible to calculate an image conversion function using a golden image generated from the pattern image of a semiconductor device. Furthermore, according to example embodiments, it is possible to calculate a high-magnification image conversion function using a high-magnification image based on a field of view (FOV) of a position at which a fault is found in the defect reaction image. Accordingly, a margin of error of the fault coordinate may be reduced, and accuracy of the fault detection may be improved.

Effects of the present disclosure are not limited to those described above and other effects may be made apparent to those skilled in the art from the following description.

BRIEF DESCRIPTION OF THE DRAWINGS

The aspects, features, and advantages of the invention will become apparent and more readily appreciated from the following description of example embodiments, taken in conjunction with the accompanying drawings of which.

DETAILED DESCRIPTION

Figure 1:
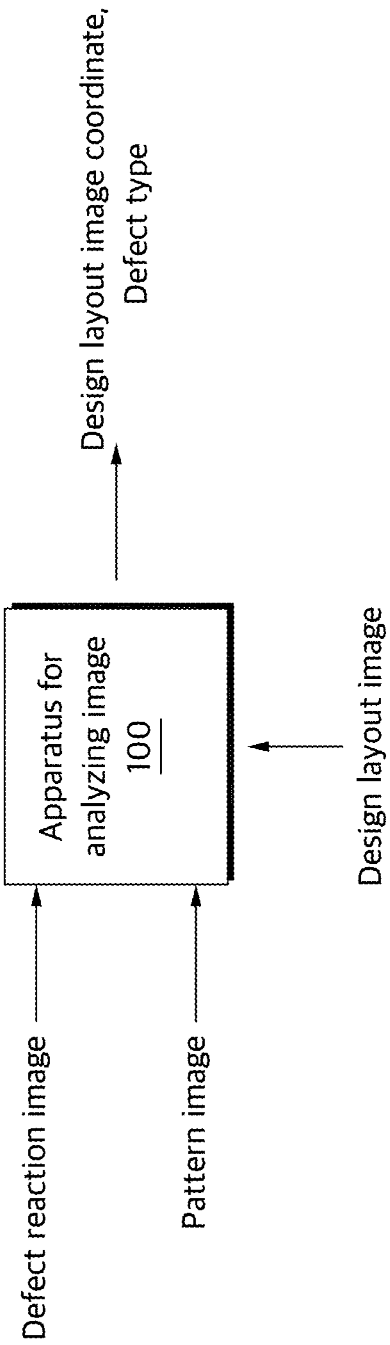
FIG. 1 is a diagram illustrating the operation of an apparatus for analyzing an image according to an example embodiment.

Terms (including technical and scientific terms) used in the following description of the example embodiments used herein have the same meaning as commonly understood by one of ordinary skill in the art to which this disclosure belongs. Also, some terms may be arbitrarily used in the present disclosure. In such instances, the meanings of these terms may be described in corresponding description parts of the disclosure. Accordingly, it should be noted that the terms used herein should be construed as having a meaning that is consistent with their meaning in the context of the relevant art and/or the present application, and should not be interpreted in an idealized or overly formal sense unless expressly so defined herein.

In the entire specification, when an element is referred to as "including" another element, the other element should not be understood as excluding additional elements so long as there is no special conflicting description, and the element may include at least one other element.

In the following description, the terms "unit" and "module", for example, may refer to a component that exerts at least one function or operation, and may be realized in hardware or software, or may be realized by combination of hardware and software.

Hereinafter, example embodiments of the present disclosure will be described with reference to the accompanying drawings in which various embodiments are shown. The invention may, however, be embodied in many different forms and should not be construed as limited to the example embodiments set forth herein. It should also be emphasized that the disclosure provides details of alternative examples, but such listing of alternatives is not exhaustive. Furthermore, any consistency of detail between various examples should not be interpreted as requiring such detail. The language of the claims should be referenced in determining the requirements of the invention.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Items described in the singular herein may be provided in plural, as can be seen, for example, in the drawings. Thus, the description of a single item that is provided in plural should be understood to be applicable to the remaining plurality of items unless context indicates otherwise.

FIG. 1 is a diagram illustrating the operation of an apparatus for analyzing an image according to an example embodiment.

Referring to FIG. 1, an apparatus 100 for analyzing an image may analyze a defect reaction image, a pattern image, and a design layout image to extract a design layout image coordinate and/or a type of a defect of a semiconductor device.

According to an example embodiment, the defect reaction image and the pattern image may each be acquired by optically imaging a sample (e.g., a semiconductor substrate). An imaging apparatus may image the sample to produce the defect reaction image and the pattern image. The sample may be a semiconductor substrate including a plurality of semiconductor devices that each have the same design (e.g., the semiconductor substrate may have a repeating pattern of identical semiconductor devices apart from any manufacturing defects). Here, the defect reaction image may be an image acquired by optically imaging the sample to capture a response to an electrical signal applied to the semiconductor device. In addition, the pattern image may be an image acquired by optically imaging a structure of the semiconductor device. The defect reaction image and the pattern image may each be acquired without modification to the parameters of the image acquisition apparatus such that they share the same measurement domain.

According to an example embodiment, the image acquisition apparatus that acquires the defect reaction image and/or the pattern image may be an optical fault isolation (OFI) system. The OFI system may acquire the defect reaction image by applying the electrical signal to an electrode pad provided along a periphery of the semiconductor device and imaging, through an optical lens of the OFI system, the semiconductor device as it operates in response to the electrical signal. The OFI system may acquire the pattern image by optically imaging the semiconductor device through the optical lens without applying the electrical signal to the semiconductor device.

According to an example embodiment, the image acquisition apparatus may be a microscope (e.g., a scanning electron microscope (SEM)) that acquires the pattern image. The microscope may acquire an image of a sample surface by converting, into an image signal, the presence of a secondary electron that occurs from an interaction between an electron beam and the sample while scanning the sample surface with the electron beam. In such embodiments, the pattern image may be an SEM image or a transmission electron microscope (TEM) image showing at least one pattern included in the semiconductor device.

An imaging apparatus for acquiring the defect reaction image and/or the pattern image may be implemented as an external electronic apparatus other than the apparatus 100 for analyzing the image or may be implemented as an integral component of the apparatus 100 for analyzing the image.

According to an example embodiment, the design layout image may be generated by the apparatus 100 for analyzing the image. According to an example embodiment, the apparatus 100 for analyzing the image may generate the design layout image by rasterizing a design layout corresponding to a process design drawing of the semiconductor device.

Hereinafter, various example embodiments in which the apparatus 100 for analyzing the image analyzes an image (e.g., the defect reaction image, the pattern image, and/or the design layout image) will be described with reference to FIGS. 2 through 4.

Figure 2:
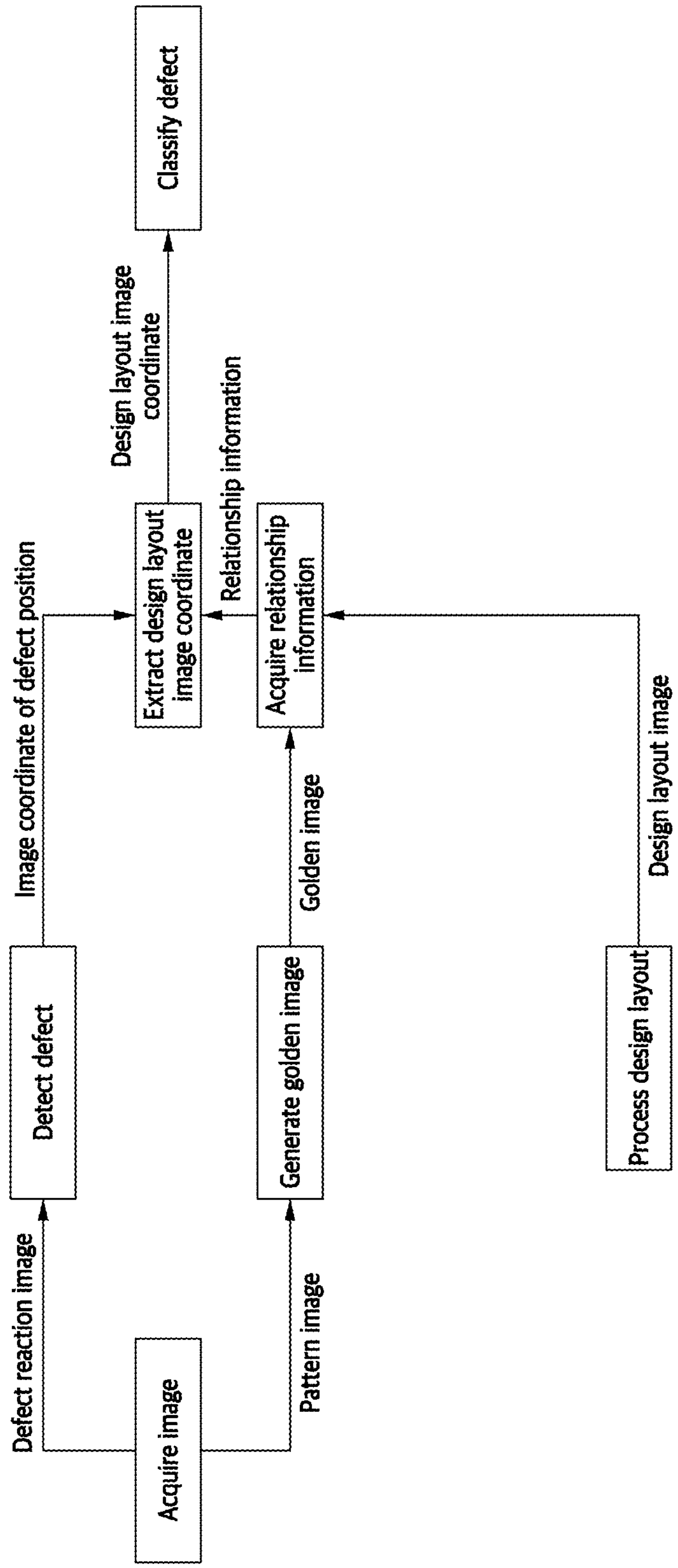
FIG. 2 is a diagram illustrating a first example embodiment of a technique for analyzing an image according to an example embodiment.

FIG. 2 is a diagram illustrating a first example embodiment of a technique for analyzing an image according to an example embodiment. The technique illustrated in FIG. 2 may be implemented by the apparatus 100 for analyzing an image. For purposes of explanation, the technique will be described in relation to the apparatus 100 for analyzing the image performing various actions of the technique.

Referring to FIG. 2, the apparatus 100 for analyzing the image may acquire a defect reaction image and a pattern image acquired by an imaging apparatus imaging a semiconductor device. For example, the defect reaction image and the pattern image may each be transmitted to the apparatus 100 for analyzing the image over a communication channel between the apparatus 100 for analyzing the image and an image source such as external storage or the imaging apparatus.

According to an example embodiment, the apparatus 100 for analyzing the image may detect an image coordinate of a defect position in the acquired defect reaction image.

According to an example embodiment, to detect a defect of the sample represented by the defect reaction image, the apparatus 100 for analyzing the image may apply, to the defect reaction image, a filter based on at least one of brightness, a size, or a shape corresponding to a predetermined defect characteristic. Here, the predetermined defect characteristic may include at least one of a brightness characteristic in which a brightness value of a pixel is within a predetermined defect range (for example, greater than or equal to a designated value), a size characteristic in which the number of adjacent pixels corresponding to the brightness characteristic is greater than or equal to a predetermined number, or a shape characteristic in which pixels corresponding to the brightness characteristics are adjacent to one another in a form similar to a predetermined shape. The predetermined defect range, the predetermined number, and the predetermined shape may vary depending on a purpose of use of a design layout image coordinate to be extracted later.

As an example, the apparatus 100 for analyzing the image may detect the image coordinate of the defect position by applying, to the defect reaction image, a filter for detecting a coordinate having a pixel brightness value within the predetermined defect range. As another example, the apparatus 100 for analyzing the image may detect the image coordinate of the defect position by applying, to the defect reaction image, a filter for detecting a plurality of coordinates at which the number of adjacent pixels corresponding to the brightness characteristic is greater than or equal to the predetermined number or at which pixels are adjacent in a form similar to the predetermined shape. In another example, a combination of applying, to the defect reaction image, a filter for detecting a coordinate having a pixel brightness value within the predetermined defect range, a filter for detecting a plurality of coordinates at which the number of adjacent pixels corresponding to the brightness characteristic is greater than or equal to the predetermined number, and/or a filter for detecting a plurality of coordinates at which adjacent pixels corresponding to the brightness characteristic are in a form similar to the predetermined shape.

According to an example embodiment, the apparatus 100 for analyzing the image may detect, as the image coordinate of the defect position, at least a portion of image coordinates detected by applying the filter. As an example, when the number of the image coordinates detected by applying the filter is greater than or equal to a designated number, the apparatus 100 for analyzing the image may detect, as the image coordinate of the defect position, the top N (N is a natural number) image coordinates among the detected image coordinates according to brightness values. As another example, when the number of the image coordinates detected by applying the filter is greater than or equal to the designated number, the apparatus 100 for analyzing the image may detect, as the image coordinate of the defect position, the top N image coordinates among the detected image coordinates according to the number of adjacent pixels.

According to an example embodiment, the apparatus 100 for analyzing the image may preprocess and/or normalize the defect reaction image. The apparatus 100 for analyzing the image may use various image processing methods and/or normalization methods which may be conventional methods for preprocessing or normalizing an image as known to one of skill in the art. According to an example embodiment, the apparatus 100 for analyzing the image may generate a de-noised image by removing noise in the defect reaction image. In this case, the apparatus 100 for analyzing the image may detect the image coordinate of the defect position by applying, to the de-noised image, the filter based on at least one of the brightness, the size, and the shape corresponding to the predetermined defect characteristic.

According to an example embodiment, the apparatus 100 for analyzing the image may generate a golden image of the semiconductor device based on the pattern image. The golden image may be imaged to correspond to the pattern image and may be an ideal image that does not have a rotation error and a position error and does not have pattern noise occurring in a semiconductor process. The golden image may correspond to the pattern image and a location of a pattern represented by a pixel at a coordinate in the golden image may correspond to same location of the pattern represented by a pixel at the same coordinate in a pattern image.

According to an example embodiment, the apparatus 100 for analyzing the image may generate the golden image based on a plurality of pattern images.

For example, the apparatus 100 for analyzing the image may generate the golden image based on brightness values of pixels corresponding to a first coordinate on the plurality of pattern images, which may be any coordinate of the plurality of pattern images. The apparatus 100 for analyzing the image may identify the brightness values of pixels corresponding to the first coordinate on the plurality of pattern images. The apparatus 100 for analyzing the image may determine an optimal brightness value among the identified brightness values of the pixels which may be a brightness value of a golden pixel corresponding to the first coordinate on the golden image based on a predetermined noise characteristic. The apparatus 100 for analyzing the image may repeatedly perform the above-described operation for multiple coordinates of golden pixels and may repeatedly perform the above-described operation for all coordinates of golden pixels to generate the golden image.

Hereinafter, an example embodiment of a technique in which the apparatus 100 for analyzing the image generates the golden image based on the plurality of pattern images will be described in detail with reference to FIG. 3.

Figure 3:
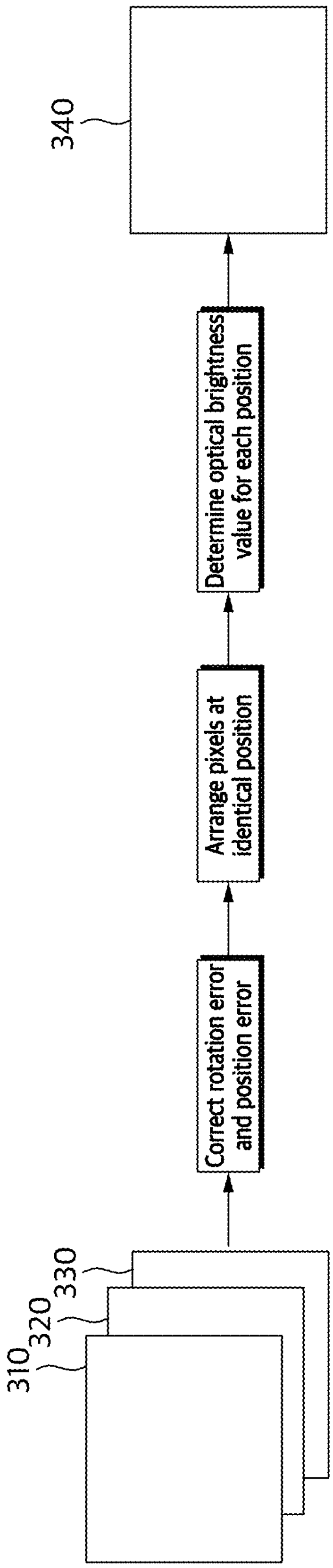
FIG. 3 is a diagram illustrating an example embodiment of a technique for generating a golden image based on a plurality of pattern images for use in analyzing an image according to an example embodiment.

FIG. 3 is a diagram illustrating an example embodiment of a technique in which an apparatus for analyzing an image according to an example embodiment generates a golden image based on a plurality of pattern images.

Referring to FIG. 3, the apparatus 100 for analyzing the image may generate a golden image 340 based on a plurality of pattern images 310, 320, and 330. In embodiments in which the apparatus 100 for analyzing the image includes an imaging apparatus, the plurality of pattern images 310, 320, and 330 may be acquired by optically imaging a plurality of semiconductor devices that correspond, on a one-to-one basis, to a plurality of dies on one semiconductor substrate (e.g., a wafer). In embodiments in which the apparatus 100 for analyzing the image does not include an imaging apparatus, the plurality of pattern images 310, 320, and 330 may be acquired by the apparatus 100 for analyzing the image receiving the plurality of pattern images 310, 320, and 330 over a communication channel from an external imaging apparatus. The plurality of semiconductor devices may be elements of an identical type that are all manufactured through an identical process (e.g., they may each be manufactured according to the same design layout).

According to an example embodiment, the apparatus 100 for analyzing the image may correct rotation errors and position errors of the plurality of pattern images 310, 320, and 330.

According to an example embodiment, the apparatus 100 for analyzing the image may calculate a rotation error of pattern image 310, pattern image 320, or pattern image 330 by comparing a reference line (e.g., a horizontal pixel line or a vertical pixel line) and an object showing a horizontal pattern (or a vertical pattern) included in the pattern image 310, the pattern image 320, or the pattern image 330 and generate a rotation conversion function (e.g., a coordinate conversion matrix) for correcting the calculated rotation error. The apparatus 100 for analyzing the image may correct the rotation error of the pattern image 310, the pattern image 320, or the pattern image 330 by applying the generated rotation conversion function to the respective pattern image.

According to an example embodiment, the apparatus 100 for analyzing the image may calculate a relative offset of the pattern image 310, the pattern image 320, or the pattern image 330 by comparing the plurality of pattern images 310, 302, and 330 and generating a position conversion function for correcting a position error based on the calculated offset. The apparatus 100 for analyzing the image may correct a position error of the pattern image 310, the pattern image 320, or the pattern image 330 by applying the generated position conversion function to the respective pattern image.

According to an example embodiment, the apparatus 100 for analyzing the image may arrange (e.g., rank) pixels in the plurality of pattern images 310, 320, and 330 for each of a plurality of identical pixel positions in the plurality of pattern images 310, 320, and 330. As an example, the apparatus 100 for analyzing the image may arrange the pixels at each of the identical pixel positions in the plurality of pattern images 310, 320, and 330 at a corresponding pixel position according to brightness values (e.g., arrange the pixels having the same pixel positions in ascending order or in descending order). As another example, the apparatus 100 for analyzing the image may also arrange the pixels having the same pixel position excluding at least one pixel having a brightness value greater (or less) than or equal to a designated value for the pixels from among the pixels at an identical pixel position in the plurality of pattern images 310, 320, and 330.

According to an example embodiment, the apparatus 100 for analyzing the image may generate the golden image 340 by determining an optimal brightness value among brightness values of pixels arranged for each pixel positions and setting the brightness value of a golden pixel corresponding to each coordinate to be the determined optimal brightness. The apparatus 100 for analyzing the image may determine the optimal brightness value among the brightness values of the arranged pixels based on a predetermined noise characteristic. As an example, when a noise characteristic is set so that a higher (or lower) brightness value is classified as stronger noise, the apparatus 100 for analyzing the image may determine a lowest (or highest) brightness value among the brightness values of the arranged pixels to be the optimal brightness value. As another example, when a mixed noise characteristic is set so that a pixel having a brightness value greater than or equal to a first brightness value or less than or equal to a second brightness value less than the first brightness value is classified as noise, the apparatus 100 for analyzing the image may determine a brightness value corresponding to an intermediate value among the brightness values of the arranged pixels to be the optimal brightness value. Here, the first brightness value may be higher than the intermediate value among all the brightness values of the pixels at the same pixel position, and the second brightness value may be lower than the intermediate value among all the brightness values of all the pixels at the same pixel positions.

Referring back to FIG. 2, the apparatus 100 for analyzing the image may generate a design layout image corresponding to a pattern image based on a design layout of a semiconductor device. The design layout image may include objects corresponding to a structure of the semiconductor device which is shown by the pattern image, but may be based on a domain different from that of the pattern image.

According to an example embodiment, the apparatus 100 for analyzing the image may identify at least one layer in the design layout as corresponding to at least one object shown in the pattern image as a critical layer.

According to an example embodiment, the apparatus 100 for analyzing the image may generate the design layout image by rasterizing data corresponding to the critical layer in the design layout. Here, the critical layer may correspond to a manufacturing process operation that the imaged semiconductor device completed. Thus, the apparatus 100 for analyzing the image may generate the design layout image by rasterizing design layout data in the design layout corresponding to the manufacturing process operation through which the semiconductor device completed.

According to an example embodiment, the apparatus 100 for analyzing the image may generate relationship information between the pattern image and the design layout image based on the pattern image, the golden image, and the design layout image. According to an example embodiment, the relationship information may include a conversion function (e.g., a conversion matrix) for domain conversion from a first domain that is a basis of a defect reaction image and the pattern image to a second domain that is a basis of the design layout image. Here, the first domain and the second domain may have different offsets, rotation angles, scales, or the like.

According to an example embodiment, the apparatus 100 for analyzing the image may generate the relationship information by matching the pattern image with the golden image and matching the golden image with the design layout image. Image matching may include calculation of differences in offsets, rotation angles, and/or scales between two different images and generation of a conversion function for domain conversion to fit an offset, a rotation angle, and/or a scale of a source image to a target image.

According to an example embodiment, the apparatus 100 for analyzing the image may generate a first sub-function for domain conversion from the first domain that is the basis of the defect reaction image and the pattern image to a third domain that is a basis of the golden image by matching the pattern image with the golden image.

According to an example embodiment, the apparatus 100 for analyzing the image may calculate a rotation parameter, of the pattern image, for the golden image. Here, the rotation parameter may show a rotation error of the pattern image in comparison with the golden image. For example, the apparatus 100 for analyzing the image may calculate the rotation parameter by comparing pixels corresponding to a vertical component and/or a horizontal component of an object that the pattern image and the golden image commonly include. The apparatus 100 for analyzing the image may generate a rotation conversion function for converting a rotation angle of the pattern image to be identical to a rotation angle of the golden image using the calculated rotation parameter. At this point, the rotation conversion function may be a rotation conversion matrix $R_{GP}$.

According to an example embodiment, the apparatus 100 for analyzing the image may calculate an offset parameter of the pattern image for the golden image. Here, the offset parameter may show a position error of the pattern image in comparison with the golden image. For example, the apparatus 100 for analyzing the image may identify a position having a highest correlation with the golden image while moving the pattern image in a horizontal direction and/or a vertical direction. The apparatus 100 for analyzing the image may calculate the offset parameter based on the identified position. The apparatus 100 for analyzing the image may generate a position conversion function for converting a position of the pattern image to be identical to a position of the golden image using the calculated offset parameter. The position conversion function may be a position conversion matrix $T_{GP}$.

According to an example embodiment, the apparatus 100 for analyzing the image may generate the first sub-function using the calculated rotation parameter and/or the calculated offset parameter. For example, the apparatus 100 for analyzing the image may generate a conversion matrix Mop corresponding to the first sub-function using the rotation conversion matrix $R_{GP}$ which is generated using the rotation parameter, the position conversion matrix $T_{GP}$ which is generated using the offset parameter, and an origin conversion matrix $T_P$ for position conversion around an origin of the pattern image. The apparatus 100 for analyzing the image may generate a conversion matrix "$M_{GP}=T_{GP}T_P^{-1}R_{GP}T_P$" corresponding to the first sub-function by multiplying the position conversion matrix $T_{GP}$, an origin conversion inverse matrix $T_P^{-1}$, the rotation conversion matrix $R_{GP}$, and the origin conversion matrix $T_P$ in sequential order.

According to an example embodiment, the apparatus 100 for analyzing the image may generate a second sub-function for domain conversion from the third domain that is the basis of the golden image to the second domain that is the basis of the design layout image by matching the golden image with the design layout image.

According to an example embodiment, the apparatus 100 for analyzing the image may acquire edge information of at least one object included the golden image and the design layout image.

As an example, the apparatus 100 for analyzing the image may acquire the edge information with a Sobel edge detection method. The Sobel edge detection method may be a method of detecting only a dominant edge having a designated threshold or more using a vertical Sobel filter and/or a horizontal Sobel filter of a designated size (e.g., 3×3) for detecting a horizontal edge and/or a vertical edge in an image. As another example, the apparatus 100 for analyzing the image may use a Canny edge detection method, a Laplacian edge detection method, or the like.

According to an example embodiment, the apparatus 100 for analyzing the image may calculate a scale parameter, of the golden image, for the design layout image based on the acquired edge information. Here, the scale parameter may show a size difference of the golden image in comparison with the design layout image. The apparatus 100 for analyzing the image may calculate the scale parameter by comparing the edge information on each image.

According to an example embodiment, the apparatus 100 for analyzing the image may adjust a scale for the edge information on the golden image and calculate a matching score between the scale-adjusted edge information on the golden image and the edge information on the design layout image. For example, the apparatus 100 for analyzing the image may calculate the matching score with the following Equations 1 through 4.

$$P_x = \frac{S_{xx}}{S_{xx}+S_{xy}},\ P_y = \frac{S_{yy}}{S_{yy}+S_{yx}} \quad \text{[Equation 1]}$$

$$R_x = \frac{S_{xx}}{S_{xx}+S_{yx}},\ R_y = \frac{S_{yy}}{S_{yy}+S_{xy}} \quad \text{[Equation 2]}$$

-continued $$\frac{1}{F_x}=\frac{1}{2}\left(\frac{1}{P_x}+\frac{1}{R_x}\right),\ \frac{1}{F_y}=\frac{1}{2}\left(\frac{1}{P_y}+\frac{1}{R_y}\right) \quad \text{[Equation 3]}$$

$$F=\frac{1}{2}(F_x+F_y)=\frac{P_xR_x}{P_x+R_x}+\frac{P_yR_y}{P_y+R_y} \quad \text{[Equation 4]}$$

In Equations 2 and 3, $S_{xx}$ is a first convolution parameter generated by a convolution calculation of horizontally directed edge information of the golden image and horizontally directed edge information of the design layout image. $S_{xy}$ is a second convolution parameter generated by a convolution calculation of the horizontally directed edge information of the golden image and vertically directed edge information of the design layout image. $S_{yx}$ is a third convolution parameter generated by convolution calculation of vertically directed edge information of the golden image and the horizontally directed edge information of the design layout image. $S_{yy}$ is a fourth convolution parameter generated by a convolution calculation of the vertically directed edge information of the golden image and the vertically directed edge information of the design layout image.

In Equation 3, $F_x$ is a first matching parameter representing a horizontal direction matching degree of the golden image and the design layout image. $F_y$ is a second matching parameter representing a vertical direction matching degree of the golden image and the design layout image.

In Equation 4, F is the matching score between the edge information on the golden image and the edge information on the design layout image.

According to an example embodiment, the apparatus 100 for analyzing the image may calculate a scale adjustment value, which allows the calculated matching score to be greater than or equal to a reference score, to be used as a scale parameter. The apparatus 100 for analyzing the image may generate a scale conversion function for converting a scale of the golden image to be identical to that of the design layout image using the calculated scale parameter. The scale conversion function may be a scale conversion matrix $S_{DG}$.

According to an example embodiment, the apparatus 100 for analyzing the image may calculate an offset parameter, of the golden image, for the design layout image based on the acquired edge information. The offset parameter may show a position error in comparison with the design layout image. The apparatus 100 for analyzing the image may generate a position conversion function for converting the position of the golden image to be identical to a position of the design layout image. At this point, the position conversion function may be a position conversion matrix $T_{DG}$.

According to an example embodiment, the apparatus 100 for analyzing the image may generate the second sub-function using the calculated scale parameter and the calculated offset parameter. For example, the apparatus 100 for analyzing the image may generate a conversion matrix $M_{DG}$ corresponding to the second sub-function using the position conversion matrix $T_{DG}$ which is generated using the offset parameter, an origin conversion matrix $T_D$ for position conversion around an origin of the design layout image, the scale conversion matrix $S_{DG}$ which is generated using the scale parameter, and an origin conversion matrix $T_G$ for position conversion around an origin of the golden image. More specifically, the apparatus 100 for analyzing the image may generate a conversion matrix "$M_{DG}=T_{DG}T_D^{-1}S_{DG}T_G$" corresponding to the second sub-function by multiplying the position conversion matrix $T_{DG}$, an origin conversion inverse matrix $T_D^{-1}$, the scale conversion matrix $S_{DG}$, and the origin conversion matrix $T_G$ in sequential order.

According to an example embodiment, the apparatus 100 for analyzing the image may generate the conversion function for the domain conversion from the first domain that is the basis of the defect reaction image and the pattern image to the second domain that is the basis of the design layout image using the first sub-function and the second sub-function. For example, the apparatus 100 for analyzing the image may generate a conversion function "$M_{DP}=M_{DG}M_{GP}$" corresponding to a function for conversion from the first domain to the second domain by multiplying the conversion matrix $M_{DG}$ corresponding to the second sub-function and the conversion matrix $M_{GP}$ corresponding to the first sub-function in sequential order.

According to an example embodiment, the apparatus 100 may extract a design layout image coordinate corresponding to a defect position in a defect reaction image from the design layout image using an image coordinate of the defect position in the defect reaction image and the relationship information between the pattern image and the design layout image. For example, the apparatus 100 for analyzing the image may extract the design layout image coordinate by performing domain conversion of the image coordinate of the defect position in the defect reaction image from the first domain to the second domain by applying the conversion function for the domain conversion from the first domain that is the basis of the defect reaction image and the pattern image to the second domain that is the basis of the design layout image.

According to an example embodiment, the apparatus 100 for analyzing the image may perform a unit conversion of a unit (e.g., a pixel unit) of the extracted design layout image coordinate into a length unit (e.g., a μm unit).

According to an example embodiment, the apparatus 100 for analyzing the image may perform the unit conversion of the unit of the design layout image coordinate into the length unit using length information of one pixel (e.g., 4 μm for each one pixel) of the design layout image. For example, the apparatus 100 for analyzing the image may generate a unit conversion matrix $M_D$, which uses the length information of one pixel (e.g., 4 μm for one pixel) of the design layout image to perform the unit conversion of the unit of the design layout image coordinate into the length unit, using a unit conversion matrix $S_{DD}$ generated using the length information, the origin conversion matrix $T_D$ for the position conversion around the origin of the design layout image, and a flip matrix $F_D$ for converting a vertical component of the design layout image from a positive number to a negative number and from a negative number to a positive number. More specifically, the apparatus 100 for analyzing the image may generate a unit conversion matrix "$M_D=T_D^{-1}S_{DD}F_D$" by multiplying the origin conversion inverse matrix $T_D^{-1}$, the unit conversion matrix $S_{DD}$, and the flip matrix $F_D$ in sequential order.

According to an example embodiment, the apparatus 100 for analyzing the image may identify, based on a nondestructive defect classification algorithm, a defect type corresponding to the design layout image coordinate of which the unit is converted.

According to an example embodiment, the apparatus 100 for analyzing the image may calculate the shortest distance between an object included in a predetermined classification layer and the design layout image coordinate of which the unit is converted. Here, the classification layer may correspond to a predetermined type of a defect of the semiconductor device, and a unit of the shortest distance may be a length unit (e.g., the μm unit). The apparatus 100 for analyzing the image may define relationships between a defect type corresponding to the classification layer and the design layout image coordinate by comparing the calculated shortest distance and a predetermined threshold distance. As an example, when the calculated shortest distance is less than or equal to the predetermined threshold distance, the apparatus 100 for analyzing the image may define the design layout image coordinate and the defect type corresponding to the classification layer as being related. As another example, when the calculated shortest distance exceeds the predetermined threshold distance, the apparatus 100 for analyzing the image may define the design layout image coordinate and the defect type corresponding to the classification layer as being unrelated.

According to an example embodiment, the apparatus 100 for analyzing the image may define relationship between all classification layers and the design layout image coordinate according to the above-described method and store the relationship in a memory. Here, the classification layers may correspond, on a one-to-one basis, to defect types different from each other.

According to another example embodiment, the apparatus 100 for analyzing the image may store, in the memory, the extracted design layout image coordinate as data usable in physical failure analysis (PFA) corresponding to destructive analysis.

Figure 4:
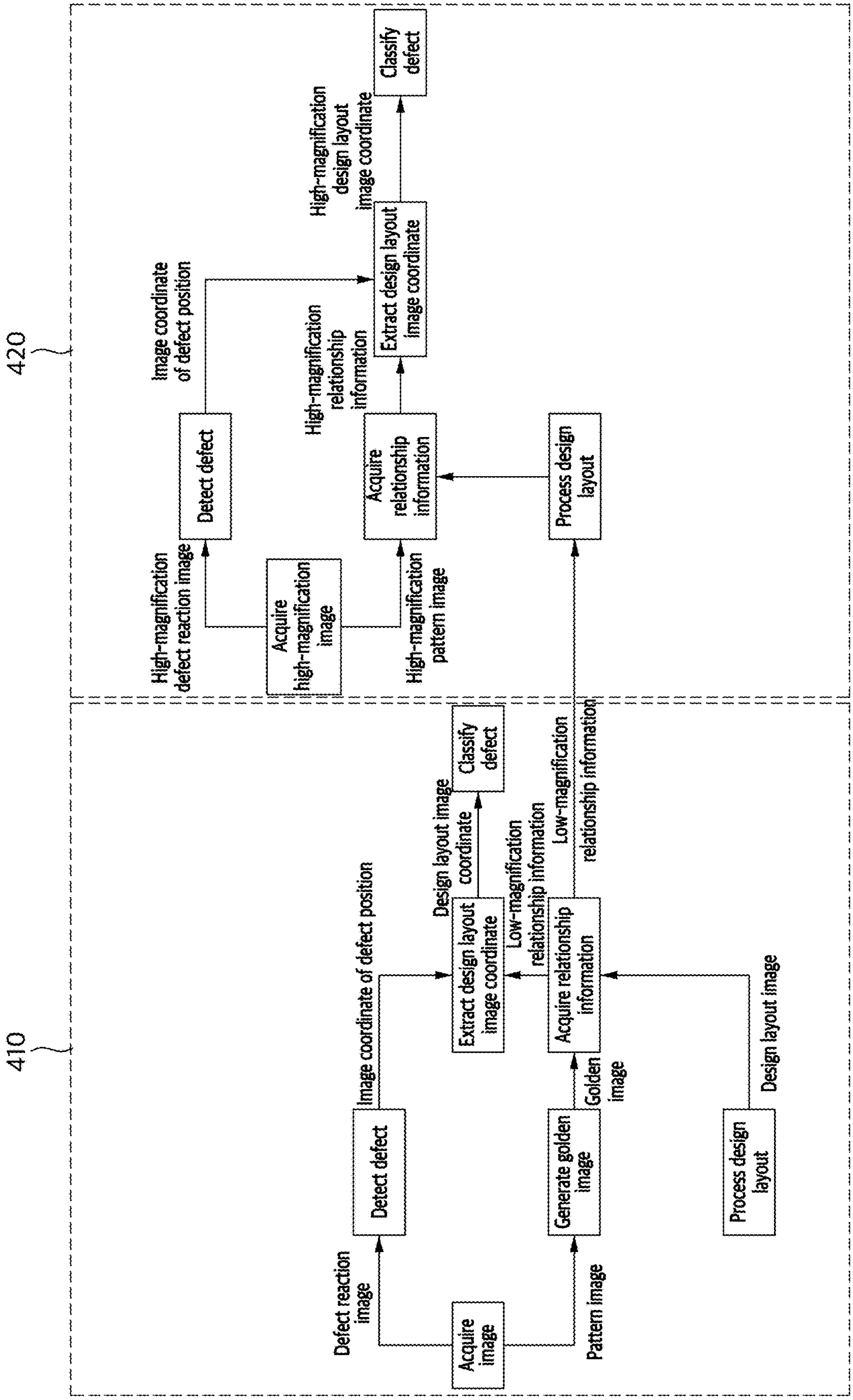
FIG. 4 is a diagram illustrating a second example embodiment of a technique for analyzing an image according to an example embodiment.

FIG. 4 is a diagram illustrating a second example embodiment of a technique in which an apparatus for analyzing an image analyzes an image.

Referring to FIG. 4, the apparatus 100 for analyzing the image may analyze a low-magnification image and a high-magnification image by hierarchically performing the first example embodiment which is described above through FIGS. 2 and 3 and represented by reference numeral 410 and the second example embodiment which is represented by reference numeral 420 and will be described below. Hereinafter, descriptions of features that would be redundant to those of FIGS. 2 and 3 may be omitted for the first example embodiment 410. Also, images (e.g., a defect reaction image, a pattern image, a golden image, and a design layout image) acquired or generated in the first example embodiment 410 may be referred to as low-magnification images (e.g., a low-magnification defect reaction image, a low-magnification pattern image, a low-magnification golden image, and a low-magnification design layout image).

According to an example embodiment, the apparatus 100 for analyzing the image may acquire a high-magnification defect reaction image and a high-magnification pattern image which were acquired by imaging a semiconductor device based on a high-magnification field of view (FOV). Here, the high-magnification FOV may include a defect position in the low-magnification defect reaction image, but may image a smaller portion of the semiconductor device than the entire FOV of the low-magnification defect reaction image. For example, the high-magnification FOV may be set based on an area having a designated number or more of defects in the low-magnification defect reaction image. The high-magnification defect reaction image (or the high-magnification pattern image) and the low-magnification defect reaction image (or the low-magnification pattern image) may be based on FOVs different from each other, but may be acquired with an identical method.

According to an example embodiment, the apparatus 100 for analyzing the image may detect a high-magnification image coordinate of the defect position in the high-magnification defect reaction image. The apparatus 100 for analyzing the image may detect the high-magnification image coordinate of the defect position in the high-magnification defect reaction image based on a method identical to the above-described method of detecting an image coordinate of the defect position in the low-magnification defect reaction image.

According to an example embodiment, the apparatus 100 for analyzing the image may generate a high-magnification design layout image corresponding to the high-magnification pattern image based on a design layout of the semiconductor device, the high-magnification FOV, and/or relationship information between the low-magnification pattern image and the low-magnification design layout image. Here, the high-magnification design layout image may include an object corresponding to a structure of the semiconductor device shown by the high-magnification pattern image, but may be based on a domain different from that of the high-magnification pattern image. In FIG. 4, the relationship information between the low-magnification pattern image and the low-magnification design layout image may be referred to as low-magnification relationship information.

According to an example embodiment, the apparatus 100 for analyzing the image may generate converted coordinate information from coordinate information included in the high-magnification FOV using the low-magnification relationship information. For example, the apparatus 100 for analyzing the image may generate the converted coordinate information by applying, to the coordinate information included in the high-magnification FOV, a function for domain conversion from a first domain that is a basis of the low-magnification defect reaction image and the low-magnification pattern image to a second domain that is a basis of the low-magnification design layout image.

According to an example embodiment, the apparatus 100 for analyzing the image may generate the high-magnification design layout image by rasterizing data corresponding to the converted coordinate information in the design layout of the semiconductor device. For example, the apparatus 100 for analyzing the image may generate a temporary image by rasterizing the data corresponding to the converted coordinate information in the design layout of the semiconductor device, and then extract the high-magnification design layout image corresponding to an entire area of the high-magnification pattern image from the temporary image. Accordingly, the apparatus 100 for analyzing the image may generate the high-magnification design layout image which has a scale identical to that of the high-magnification pattern image.

According to an example embodiment, the apparatus 100 for analyzing the image may generate high-magnification relationship information between the high-magnification pattern image and the high-magnification design layout image based on the high-magnification pattern image and the high-magnification design layout image. According to an example embodiment, the high-magnification relationship information may include a high-magnification conversion function (e.g., a conversion matrix) for domain conversion from a first high-magnification domain that is a basis of the high-magnification defect reaction image and the high-magnification pattern image to a second high-magnification that is a basis of the high-magnification design layout image. Here, the first high-magnification domain and the second high-magnification domain may have different offsets, rotation angles, scales, or the like.

According to an example embodiment, the apparatus 100 for analyzing the image may generate the high-magnification relationship information between the high-magnification pattern image and the high-magnification design layout image by matching the high-magnification pattern image with the high-magnification design layout image.

According to an example embodiment, the apparatus 100 for analyzing the image may acquire the high-magnification edge information on at least one object included in the high-magnification pattern image and the high-magnification design layout image. As an example, the apparatus 100 may acquire the high-magnification edge information with a Sobel edge detection method. As another example, the apparatus 100 for analyzing the image may use a Canny edge detection method, a Laplacian edge detection method, or the like.

According to an example embodiment, the apparatus 100 for analyzing the image may calculate a high-magnification rotation parameter, of the high-magnification pattern image, for the high-magnification design layout image based on the acquired high-magnification edge information. Here, the high-magnification rotation parameter may show a rotation error of the high-magnification pattern image in comparison with the high-magnification design layout image. For example, the apparatus 100 for analyzing the image may calculate the high-magnification rotation parameter by comparing horizontal edge information and/or vertical edge information on the on the high-magnification pattern image and the high-magnification design layout image with each other. The apparatus 100 for analyzing the image may generate a high-magnification rotation conversion function for converting a rotation angle of the high-magnification pattern image to be identical to a rotation angle of the high-magnification design layout image using the calculated high-magnification rotation parameter. At this point the high-magnification rotation parameter may be a high-magnification rotation conversion matrix $R_{DP}$.

According to an example embodiment, the apparatus 100 for analyzing the image may calculate a high-magnification offset parameter, of the high-magnification patter image, for the high-magnification design layout image based on the acquired high-magnification edge information. Here, the high-magnification offset parameter may show a position error of the high-magnification pattern image in comparison with the high-magnification design layout image. For example, the apparatus 100 for analyzing the image may identify a position having a highest correlation between edge information on the high-magnification pattern image and edge information high-magnification on the high-magnification design layout image while moving the high-magnification pattern image in a horizontal direction and/or a vertical direction. The apparatus 100 for analyzing the image may calculate the high-magnification offset parameter based on the identified position. The apparatus 100 for analyzing the image may generate a high-magnification position conversion function for converting a position of the high-magnification pattern image to be identical to a position of the high-magnification design layout image using the calculated high-magnification offset parameter. At this point, the high-magnification position conversion function may be a high-magnification position conversion matrix $T_{DP}$.

According to an example embodiment, the apparatus 100 for analyzing the image may generate the high-magnification conversion function using the calculated high-magnification rotation parameter and/or the high-magnification offset parameter. For example, the apparatus 100 for analyzing the image may generate a high-magnification conversion matrix $M_{DP}$ corresponding to the high-magnification conversion function using the high-magnification rotation conversion matrix $R_{DP}$ which is generated using the high-magnification rotation parameter, the high-magnification position conversion matrix $T_{DP}$ which is generated using the high-magnification offset parameter, and a high-magnification origin conversion matrix $T_P$ for position conversion around an origin of the high-magnification pattern image. More specifically, the apparatus 100 for analyzing the image may generate a conversion matrix "$M_{DP}=T_{DP}T_P^{-1}R_{DP}T_P$" corresponding to the high-magnification conversion function by multiplying the high-magnification position conversion matrix $T_{DP}$, a high-magnification origin conversion inverse matrix $T_P^{-1}$, the high-magnification rotation conversion matrix $R_{DP}$, and the high-magnification origin conversion matrix $T_P$ in sequential order.

According to an example embodiment, the apparatus 100 for analyzing the image may extract a high-magnification design layout image coordinate corresponding to the defect position from the high-magnification design layout image using the high-magnification image coordinate of the defect position and the high-magnification relationship information. For example, the apparatus 100 for analyzing the image may extract the high-magnification design layout image coordinate by performing domain conversion of the high-magnification image coordinate of the defect position in the high-magnification defect reaction image from the first high-magnification domain to the second high-magnification domain by applying the high-magnification conversion function for the domain conversion from the first high-magnification domain that is the basis of the high-magnification defect reaction image and the high-magnification pattern image to the second high-magnification that is the basis of the high-magnification design layout image.

According to an example embodiment, the apparatus 100 for analyzing the image may perform unit conversion of a unit (e.g., a pixel unit) of the extracted high-magnification design layout image coordinate into a length unit (e.g., a µm unit). The apparatus 100 for analyzing the image may perform the unit conversion of the unit of the high-magnification design layout image coordinate into the length unit based on a method identical to the above-described method for unit conversion of a unit of a low-magnification design layout image coordinate into a length unit.

According to an example embodiment, the apparatus 100 for analyzing the image may identify, based on a nondestructive defect classification algorithm, a defect type corresponding to the high-magnification design layout image coordinate of which the unit is converted. Here, the nondestructive defect classification algorithm may be identical to the nondestructive defect classification algorithm described above in the first example embodiment 410 of FIGS. 2 and 3.

According to another example embodiment, the apparatus 100 for analyzing the image may store, in a memory, the extracted high-magnification design layout image coordinate as data usable in physical failure analysis (PFA) corresponding to destructive analysis.

Figure 5:
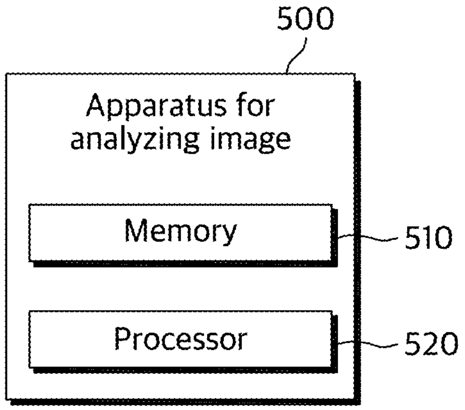
FIG. 5 is a diagram illustrating an apparatus for analyzing an image according to an example embodiment.

FIG. 5 is a diagram illustrating an apparatus for analyzing an image according to an example embodiment.

Referring to FIG. 5, an apparatus 500 for analyzing an image may include a memory 510 and a processor 520. The apparatus 500 for analyzing the image of FIG. 5 may be an apparatus identical to the apparatus 100 for analyzing the image of FIG. 1.

Depending on example embodiments, the apparatus 500 for analyzing the image, which is illustrated in FIG. 5, may further include at least one element (e.g., a communication circuit, a display, an input device, or an output device) in addition to elements illustrated in FIG. 5. For example, the apparatus 500 for analyzing the image may acquire a defect reaction image and a pattern image from an external image acquisition apparatus (e.g., an optical defect detection apparatus) using a communication circuit.

According to an example embodiment, the memory 510 may include a volatile memory and/or a non-volatile memory.

According to an example embodiment, the memory 510 may store data used by at least one element (e.g., the processor 520) of the apparatus 500 for analyzing the image. For example, the data may include software (or at least one instruction associated therewith), input data, or output data. In an example embodiment, when executed by the processor 520, the at least one instruction may allow the apparatus 500 for analyzing the image to perform operations defined by an instruction.

According to an example embodiment, the processor 520 may include a central processing unit, an application processor, a graphics processing unit, a neural processing unit (NPU), an image signal processor, a sensor hub processor, or a communication processor.

According to an example embodiment, the processor 520 may control at least one different element (e.g., a hardware or software element) of the apparatus 500 for analyzing the image, which is connected to the processor 520, by executing software stored in the memory 510 and may perform a variety of data processing and calculation. For example, the processor 520 may perform, by executing at least one instruction stored in the memory 510, the operations described above in FIGS. 1 through 4.

Figure 6:
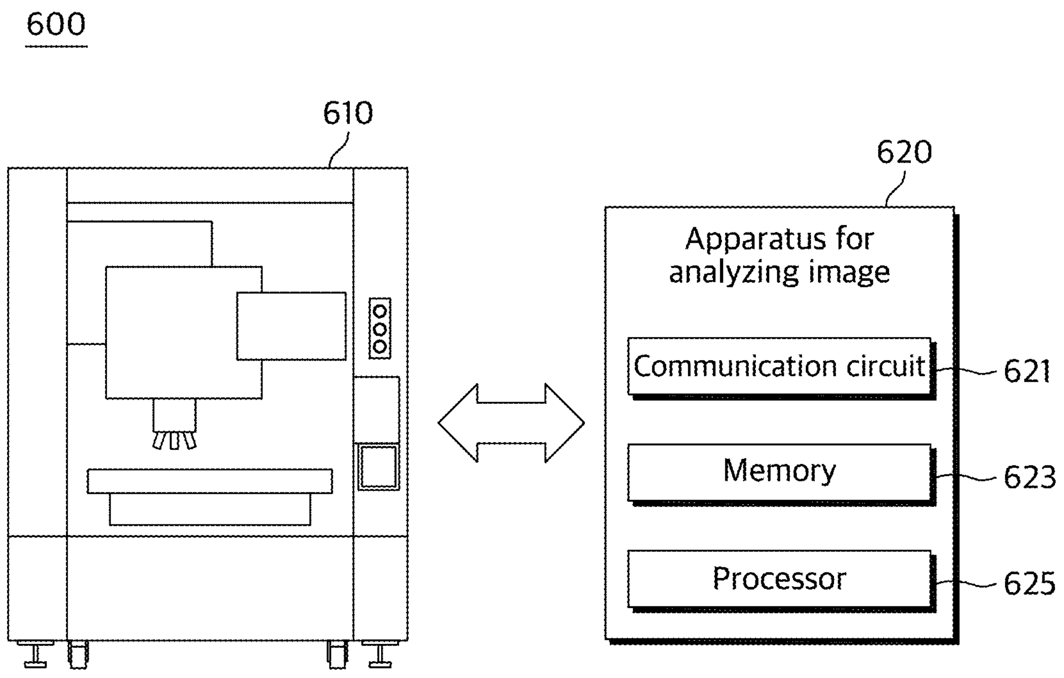
FIG. 6 is a diagram illustrating a system for analyzing an image according to an example embodiment.

FIG. 6 is a diagram illustrating a system for analyzing an image according to an example embodiment.

Referring to FIG. 6, an apparatus 620 for analyzing an image may be connected to an image acquisition apparatus 610 by wire and/or wirelessly. The apparatus 620 for analyzing the image of FIG. 6 may be an apparatus identical to the apparatus 100 for analyzing the image of FIG. 1.

According to an example embodiment, connection between the image acquisition apparatus 610 and the apparatus 620 for analyzing the image may be communication connection through a wired and/or wireless network. In an example embodiment, the wired network may be based on a short-range communication network (e.g., Bluetooth, Wireless Fidelity (Wi-Fi), or infrared data association (IrDA)) or a long-range communication network (e.g., a cellular network, a 4th generation (4G) network, or a 5th generation (5G) network).

According to another example embodiment, the connection between the image acquisition apparatus 610 and the apparatus 620 for analyzing the image may be connection through a device-to-device communication scheme (e.g., a bus, general purpose input and output (GPIO), a serial peripheral interface (SPI), or a mobile industry processor interface (MIPI)).

According to an example embodiment, the image acquisition apparatus 610 may acquire a defect reaction image and a pattern image by optically imaging a semiconductor device.

According to an example embodiment, the image acquisition apparatus 610 may be an OFI apparatus. In an example embodiment, the image acquisition apparatus 610 may be an apparatus that acquires the defect reaction image by applying an electrical signal to an electrode pad provided along a periphery of the semiconductor device and imaging, through an optical lens, the semiconductor device which operates in response thereto. In an example embodiment, the image acquisition apparatus 610 may acquire the pattern image by optically imaging the semiconductor device through the optical lens without applying the electrical signal to the semiconductor device.

According to an example embodiment, the image acquisition apparatus 610 may be a microscope (e.g., a scanning electron microscope). In an example embodiment, the image acquisition apparatus 610 may be an apparatus that acquires an image of a sample (e.g., a semiconductor substrate) surface by converting, into an image signal, a secondary electron occurring by an interaction between an electron beam and a sample while scanning the sample surface with the electron beam. For example, the image acquisition apparatus 610 may acquire the pattern image in which a structure of the semiconductor device, which is disposed to the semiconductor substrate, is optically imaged by scanning the semiconductor substrate with the electron beam.

According to an example embodiment, the apparatus 620 for analyzing the image may include a communication circuit 621, a memory 623, and a processor 625. Here, the memory 623 and processor 625 may be identical to the memory 510 and the processor 520 of FIG. 5.

According to an example embodiment, the communication circuit 621 may establish a wired communication channel and/or a wireless communication channel between the image acquisition apparatus 610 and the apparatus 620 for analyzing the image and transmit and receive data to and from the image acquisition apparatus 610 through the established communication channel. For example, the communication circuit 621 may receive the defect reaction image and the pattern image of the semiconductor device from the image acquisition apparatus 610.

Figure 7:
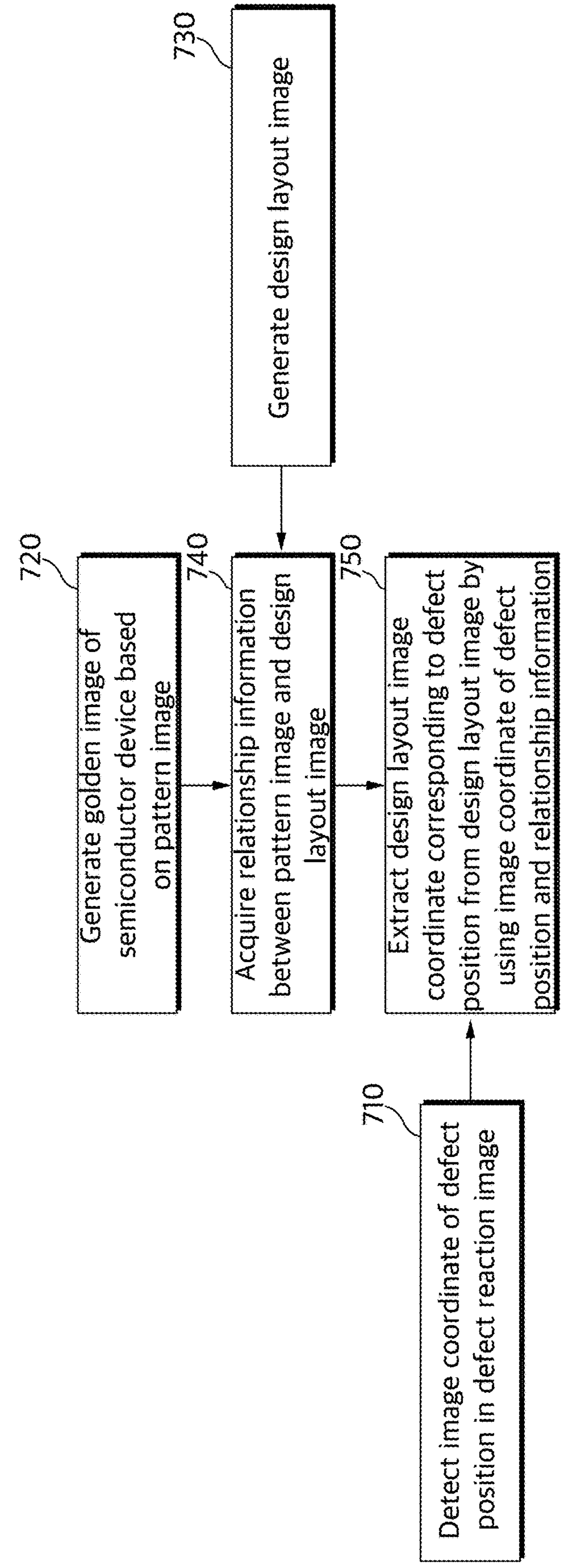
FIG. 7 is a flowchart illustrating a method of operation of an apparatus for analyzing an image according to an example embodiment.

FIG. 7 is a flowchart illustrating a method of operation of an apparatus for analyzing an image according to an example embodiment. Since the operation method in FIG. 7 may be performed by the apparatus 100 for analyzing the image according to FIGS. 1 through 4 described above, redundant descriptions similar to those of FIGS. 1 through 4 may be omitted.

An example embodiment illustrated in FIG. 7 is merely an example embodiment. An order of operations according to various example embodiments of the present disclosure may be different from an illustration of FIG. 7. Some operations illustrated in FIG. 7 may be omitted, an order thereof may be changed, or the operations may be merged.

Referring to FIG. 7, in operation 710, the apparatus 100 for analyzing the image may detect an image coordinate of a defect position in a defect reaction image acquired by imaging a semiconductor device. According to an example embodiment, the defect reaction image may be an image acquired by optically imaging a response to an electrical signal applied to the semiconductor device.

Operation 710 in which the apparatus 100 for analyzing the image detects the image coordinate of the defect position in the defect reaction image may be described in detail through FIG. 8 that will be described below.

In operation 720, the apparatus 100 for analyzing the image may generate a golden image of the semiconductor device based on a pattern image acquired by imaging the semiconductor device. According to an example embodiment, the pattern image may be an image acquired by optically imaging a structure of the semiconductor device. According to an example embodiment, the apparatus 100 for analyzing the image may generate the golden image based on brightness values of pixels having the same coordinate in a plurality of pattern images.

In operation 730, the apparatus 100 for analyzing the image may generate a design layout image corresponding to the pattern image based on a design layout of the semiconductor device. Here, the design layout image may include an object corresponding to the structure of the semiconductor device, but may be based on a domain different from that of the pattern image.

In operation 740, the apparatus 100 for analyzing the image may generate relationship information between the pattern image and the design layout image. According to an example embodiment, the apparatus 100 for analyzing the image may generate the relationship information between the pattern image and the design layout image based on the pattern image, the golden image, and the design layout image. According to an example embodiment, the relationship information may include a conversion function (a conversion matrix) for domain conversion from a first domain that is a basis of the defect reaction image and the pattern image to a second domain that is a basis of the design layout image. Here, the first domain and the second domain may have different offsets, rotation angles, scales, or the like.

Operation 740, in which the apparatus 100 for analyzing the image generates the conversion function from the first domain to the second domain, may be described in detail through FIG. 9 that will be described below.

In operation 750, the apparatus 100 for analyzing the image may extract a design layout image coordinate corresponding to the defect position from the design layout image using the image coordinate of the defect position, which is detected in operation 710, and the relationship information generated in operation 740.

Figure 8:
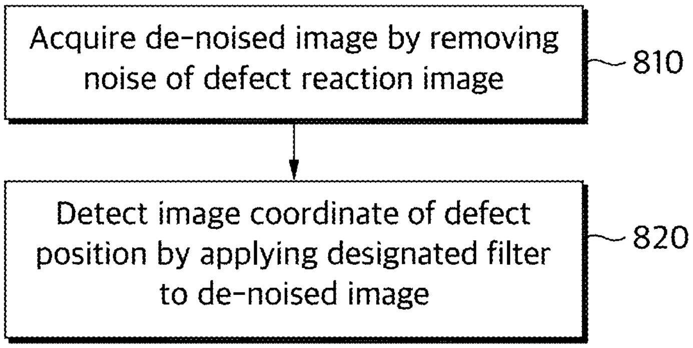
FIG. 8 is a flowchart illustrating a method of operation of an apparatus for analyzing an image according to an example embodiment.

FIG. 8 is a flowchart illustrating an operation method of an apparatus of analyzing an image according to an example embodiment. Since the operation method in FIG. 8 may be performed by the apparatus 100 for analyzing the image according to FIGS. 1 through 4 as described above, descriptions that would be redundant to those of FIGS. 1 through 4 may be omitted.

An example embodiment illustrated in FIG. 8 is merely an example embodiment. An order of operations according to various example embodiments of the present disclosure may be different from an illustration of FIG. 8. Some operations illustrated in FIG. 8 may be omitted, an order thereof may be changed, or the operations may be merged.

Referring to FIG. 8, in operation 810, the apparatus 100 for analyzing the image may generate a de-noised image by removing noise of the defect reaction image. At this point, the apparatus 100 for analyzing the image may use various image processing methods and/or normalization methods to de-noise an image, which may be conventional methods known to those of skill in the art.

In operation 820, the apparatus 100 for analyzing the image may detect an image coordinate of a defect position by applying a designated filter to the de-noised image generated in operation 810. According to an example embodiment, the designated filter may be based on at least one of brightness, a size, and a shape corresponding to a predetermined defect characteristic. Here, the predetermined defect characteristic may include at least one of a brightness characteristic in which a brightness value of a pixel is within a predetermined defect range (for example, greater than or equal to a designated value), a size characteristic in which the number of adjacent pixels corresponding to the brightness characteristic is greater than or equal to a predetermined number, and a shape characteristic in which pixels corresponding to the brightness characteristic are adjacent in a form similar to a predetermined shape.

Figure 9:
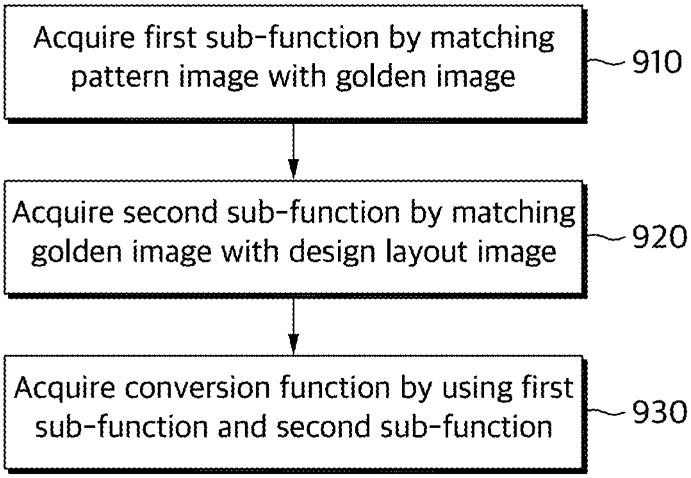
FIG. 9 is a flowchart illustrating a method of operation of an apparatus for analyzing an image according to an example embodiment.

FIG. 9 is a flowchart illustrating an operation method of an apparatus of analyzing an image according to an example embodiment. Since the operation method in FIG. 9 may be performed by the apparatus 100 for analyzing the image according to FIGS. 1 through 4 described above, descriptions that would be redundant to those of FIGS. 1 through 4 may be omitted.

An example embodiment illustrated in FIG. 9 is merely an example embodiment. An order of operations according to various example embodiments of the present disclosure may be different from an illustration of FIG. 9. Some operations illustrated in FIG. 9 may be omitted, an order thereof may be changed, or the operations may be merged.

Referring to FIG. 9, in operation 910, the apparatus 100 for analyzing the image may generate a first sub-function for domain conversion from a first domain that is a basis of a defect reaction image and a pattern image to a third domain that is a basis of a golden image by matching the pattern image with the golden image.

In operation 920, the apparatus 100 for analyzing the image may generate a second sub-function for domain conversion from the third domain that is the basis of the golden image to a second domain that is a basis of a design layout image by matching the golden image with the design layout image.

In operation 930, the apparatus 100 for analyzing the image may generate a conversion function for domain conversion from the first domain that is the basis of the defect reaction image and the pattern image to the second domain that is the basis of the design layout image using the first sub-function generated in operation 910 and the second sub-function generated in operation 920.

Figure 10:
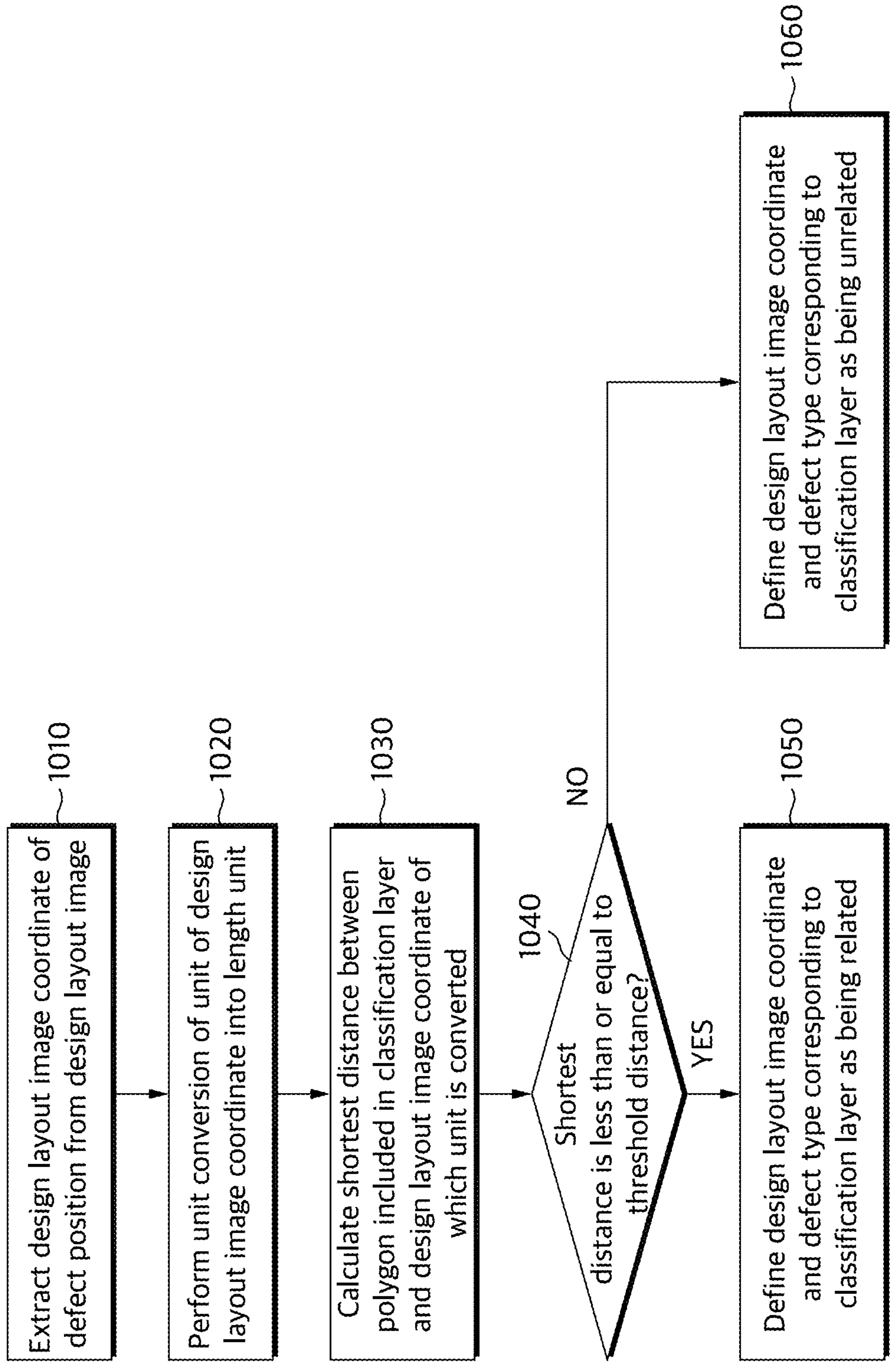
FIG. 10 is a flowchart illustrating a method of operation of an apparatus for analyzing an image according to an example embodiment.

FIG. 10 is a flowchart illustrating an operation method of an apparatus of analyzing an image according to an example embodiment. Since the operation method in FIG. 10 may be performed by the apparatus 100 for analyzing the image according to FIGS. 1 through 4 described above, descriptions that would be redundant similar to those of FIGS. 1 through 4 may be omitted.

An example embodiment illustrated in FIG. 10 is merely an example embodiment. An order of operations according to various example embodiments of the present disclosure may be different from an illustration of FIG. 10. Some operations illustrated in FIG. 10 may be omitted, an order thereof may be changed, or the operations may be merged.

Referring to FIG. 10, in operation 1010, the apparatus 100 for analyzing the image may extract a design layout image coordinate corresponding to a defect position from a design layout image. Operation 1010 may be identical to operation 750 of FIG. 7.

In operation 1020, the apparatus 100 for analyzing the image may perform unit conversion of a unit (e.g., a pixel unit) of the design layout image coordinate extracted in operation 1010 into a length unit (e.g., a μm unit).

In operation 1030, the apparatus 100 for analyzing the image may calculate the shortest distance between an object included in a predetermined classification layer and the design layout image coordinate of which the unit is converted. Here, the classification layer may correspond to a predetermined type of a defect of a semiconductor device, and a unit of the shortest distance may be a length unit (e.g., the μm unit).

In operation 1040, the apparatus 100 for analyzing the image may identify whether the shortest distance calculated in operation 1030 is less than or equal to a threshold distance.

When the shortest distance is identified as being less than or equal to the threshold distance in operation 1040 (as indicated by "YES" in FIG. 10), the apparatus 100 for analyzing the image may define the design layout image coordinate and a defect type corresponding to the classification layer as being related in operation 1050.

When the shortest distance is identified as exceeding the threshold distance in operation 1040 (as indicated by "NO" in FIG. 10), the apparatus 100 for analyzing the image may define the design layout image coordinate and the defect type corresponding to the classification layer as being unrelated in operation 1060.

Figure 11:
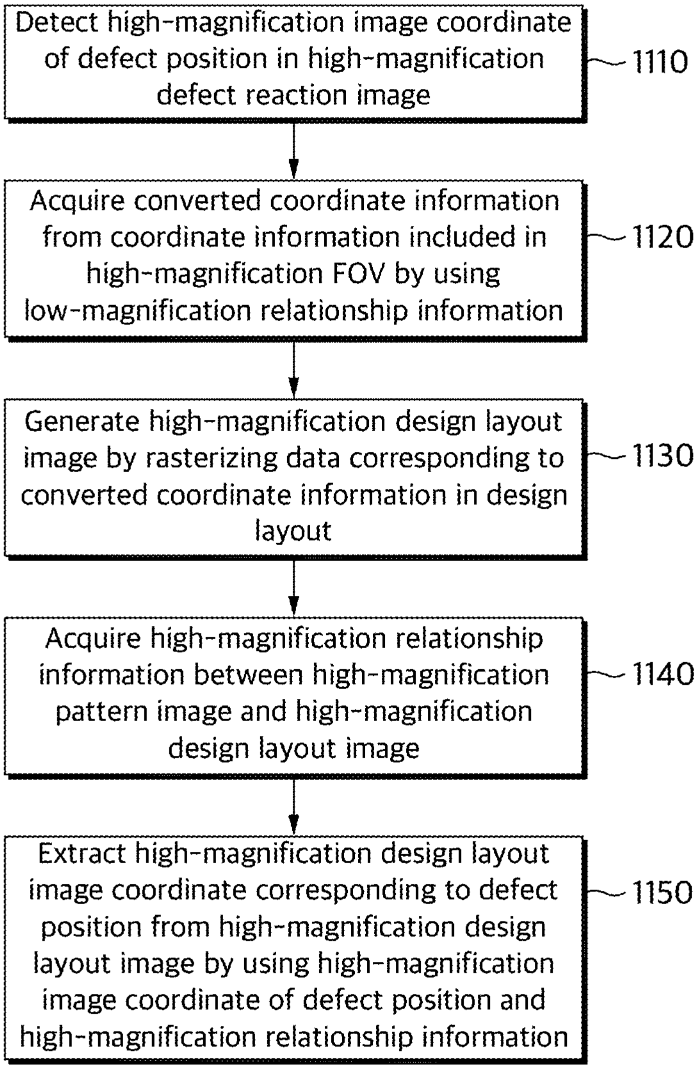
FIG. 11 is a flowchart illustrating a method of operation of an apparatus for analyzing an image according to an example embodiment.

FIG. 11 is a flowchart illustrating an operation method of an apparatus of analyzing an image according to an example embodiment. Since the operation method in FIG. 11 may be performed by the apparatus 100 for analyzing the image according to FIGS. 1 through 4 described above, descriptions that would be redundant to those of FIGS. 1 through 4 may be omitted.

An example embodiment illustrated in FIG. 11 is merely an example embodiment. An order of operations according to various example embodiments of the present disclosure may be different from an illustration of FIG. 11. Some operations illustrated in FIG. 11 may be omitted, an order thereof may be changed, or the operations may be merged.

Referring to FIG. 11, in operation 1110, the apparatus 100 for analyzing the image may detect a high-magnification image coordinate of a defect position in a high-magnification defect reaction image acquired by imaging a semiconductor device based on a high-magnification FOV.

In operation 1120, the apparatus 100 for analyzing the image may generate converted coordinate information from coordinate information included in the high-magnification FOV using low-magnification relationship information generated in operation 740 of FIG. 7.

In operation 1130, the apparatus 100 for analyzing the image may generate a high-magnification design layout image by rasterizing data corresponding to the converted coordinate information generated in operation 1120 in a design layout of the semiconductor device.

In operation 1140, the apparatus 100 for analyzing the image may generate high-magnification relationship information between a high-magnification pattern image generated by imaging the semiconductor device based on the high-magnification FOV and the high-magnification design layout image generated in operation 1130.

In operation 1150, the apparatus 100 for analyzing the image may extract a high-magnification design layout image coordinate corresponding to the defect position from the high-magnification design layout image using the high-magnification image coordinate of the defect position and the high-magnification relationship information.

The apparatus for analyzing the image in accordance with the above-described embodiments may include a processor, a memory which stores and executes program data, a permanent storage such as a disk drive, a communication port for communication with an external device, and a user interface device such as a touch panel, a key, and a button. Methods realized by software modules or algorithms may be stored in a computer-readable recording medium as computer-readable codes or program commands which may be executed by the processor. Here, the computer-readable recording medium may be a magnetic storage medium (for example, a read-only memory (ROM), a random-access memory (RAM), a floppy disk, or a hard disk) or an optical reading medium (for example, a CD-ROM or a digital versatile disc (DVD)). The computer-readable recording medium may be dispersed to computer systems connected by a network so that computer-readable codes may be stored and executed in a dispersion manner. The computer-readable recording medium may be non-transitory, may be read by a computer, may be stored in a memory, and may be executed by the processor.

The present embodiments may be represented by functional blocks and various processing steps. These functional blocks may be implemented by various numbers of hardware and/or software configurations that execute specific functions. For example, the present embodiments may adopt integrated circuit configurations such as a memory, a processor, a logic circuit, and a look-up table that may execute various functions by control of one or more microprocessors or other control devices. Elements may be executed by software programming or software elements and the present embodiments may be implemented by programming or scripting languages such as C, C++, Java, and assembler language including various algorithms implemented by combinations of data structures, processes, routines, or of other programming configurations. Functional aspects may be implemented by algorithms executed by one or more processors. In addition, the present embodiments may adopt the related art for electronic environment setting, signal processing, and/or data processing, for example. The terms "mechanism", "element", "means", and "configuration" may be widely used and are not limited to mechanical and physical components. These terms may include the meaning of a series of routines of software in association with a processor, for example.

The above-described embodiments are merely examples and other embodiments may be implemented within the scope of the following claims.

What is claimed is:

1. An apparatus for analyzing an image, the apparatus comprising:
- a memory in which at least one instruction is stored; and
- a processor operatively connected to the memory,
- wherein the processor is configured to, by executing the at least one instruction:
- detect an image coordinate of a defect position in a defect reaction image acquired by imaging a semiconductor device;
- generate a golden image of the semiconductor device based on a plurality of pattern image acquired by imaging a plurality of semiconductor devices having a design;
- generate a design layout image corresponding to the plurality of pattern images, based on a design layout of the plurality of semiconductor devices;
- generate relationship information between a pattern image of the plurality of pattern images and the design layout image based on the pattern image, the golden image, and the design layout image; and
- extract a design layout image coordinate corresponding to the defect position from the design layout image using the image coordinate of the defect position in the defect reaction image and the generated relationship information.

2. The apparatus of claim 1,
- wherein the defect reaction image is an image acquired by optically imaging a response to an electric signal applied to the semiconductor device, and
- the pattern image is an image acquired by optically imaging a structure of the semiconductor device.

3. The apparatus of claim 1, wherein the processor is further configured to, by executing the at least one instruction, detect the image coordinate of the defect position in the defect reaction image by applying, to the defect reaction image, a filter based on at least one of brightness, a size, or a shape corresponding to a predetermined defect characteristic.

4. The apparatus of claim 1, wherein the processor is further configured to, by executing the at least one instruction:

identify brightness values of pixels in the plurality of pattern images located at the same coordinate for each of the plurality of pattern images; and generate the golden image by determining an optimal brightness value among the brightness values of the pixels of the plurality of pattern images located at the same coordinates to be a brightness value of a golden pixel for each coordinate in of the golden image based on a predetermined noise characteristic.

5. The apparatus of claim 1, wherein the processor is further configured to, by executing the at least one instruction:

identify at least one layer corresponding to at least one object included in the pattern image as a critical layer; and generate the design layout image by rasterizing data corresponding to the critical layer in the design layout.

6. The apparatus of claim 1, wherein the relationship information includes a conversion function for domain conversion from a first domain that is a basis of the defect reaction image and the pattern image to a second domain that is a basis of the design layout image, and the processor is further configured to, by executing the at least one instruction, extract the design layout image coordinate by performing domain conversion of the image coordinate of the defect position from the first domain to the second domain by applying the conversion function.

7. The apparatus of claim 6, wherein the processor is further configured to, by executing the at least one instruction:

generate a first sub-function for domain conversion from the first domain to a third domain that is a basis of the golden image by matching the pattern image with the golden image;

generate a second sub-function for domain conversion from the third domain to the second domain by matching the golden image with the design layout image; and generate the conversion function applying the first sub-function and the second sub-function.

8. The apparatus of claim 7, wherein the processor is further configured to, by executing the at least one instruction:

calculate a rotation parameter, of the pattern image, for the golden image; and generate the first sub-function using the rotation parameter.

9. The apparatus of claim 8, wherein the processor is further configured to, by executing the at least one instruction:

calculate an offset parameter for the golden image of the pattern image; and generate the first sub-function by further using the offset parameter.

10. The apparatus of claim 7, wherein the processor is further configured to, by executing the at least one instruction:

acquire edge information on at least one object included in the golden image and the design layout image;

calculate a scale parameter, of the golden image, for the design layout image based on the edge information; and generate the second sub-function using the scale parameter.

11. The apparatus of claim 1, wherein the processor is further configured to, by executing the at least one instruction:

perform unit conversion of a unit of the design layout image coordinate into a length unit; and identify, based on a nondestructive defect classification algorithm, a defect type corresponding to the design layout image coordinate of which the unit is converted.

12. The apparatus of claim 11, wherein the processor is further configured to, by executing the at least one instruction:

calculate the shortest distance between an object included in a predetermined classification layer and the design layout image coordinate of which the unit is converted, and define relationship between a defect type corresponding to the predetermined classification layer and the design layout image coordinate by comparing the calculated shortest distance and a predetermined threshold distance.

13. The apparatus of claim 1, wherein the processor is further configured to, by executing the at least one instruction, store, in the memory, the design layout image coordinate as data usable in physical failure analysis (PFA) corresponding to destructive analysis.

14. The apparatus of claim 1, wherein the processor is further configured to, by executing the at least one instruction:

detect a high-magnification image coordinate of the defect position in a high-magnification defect reaction image acquired by imaging the semiconductor device based on a high-magnification field of view (FOV) smaller than an entire FOV of the defect reaction image and including the defect position in the defect reaction image;

generate, based on the design layout and the high-magnification FOV, a high-magnification design layout image corresponding to a high-magnification pattern image acquired by imaging the semiconductor device;

generate high-magnification relationship information between the high-magnification pattern image and the high-magnification design layout image based on the high-magnification pattern image and the high-magnification design layout image; and extract a high-magnification design layout image coordinate corresponding to the defect position from the high-magnification design layout image using the high-magnification image coordinate of the defect position and the generated high-magnification relationship information.

15. The apparatus of claim 14, wherein the processor is further configured to, by executing the at least one instruction:

generate converted coordinate information from coordinate information included in the high-magnification FOV using the relationship information; and generate the high-magnification design layout image by rasterizing data corresponding to the generated converted coordinate information in the design layout.

16. The apparatus of claim 14, wherein the high-magnification relationship information includes a high-magnification conversion function for domain conversion from a first high-magnification domain that is a basis of the high-magnification defect reaction image and the high-magnification pattern image to a second high-magnification domain that is a basis of the high-magnification design layout image, and the processor is further configured to, by executing the at least one instruction:

generate the high-magnification conversion function for the domain conversion from the first high-magnification domain to the second high-magnification domain by matching the high-magnification pattern image with the high-magnification design layout image; and extract the high-magnification design layout image coordinate by performing domain conversion of the high-magnification image coordinate of the defect position from the first high-magnification domain to the second high-magnification domain by applying the high-magnification conversion function.

17. The apparatus of claim 16, wherein the processor is further configured to, by executing the at least one instruction:

acquire high-magnification edge information on at least one object included in the high-magnification pattern image and the high-magnification design layout image;

calculate a high-magnification rotation parameter, of the high-magnification pattern image, for the high-magnification design layout image based on the high-magnification edge information; and acquire the high-magnification conversion function using the high-magnification rotation parameter.

18. The apparatus of claim 17, wherein the processor is further configured to, by executing the at least one instruction:

calculate a high-magnification offset parameter, of the high-magnification pattern image, for the high-magnification design layout image based on the high-magnification edge information; and generate the high-magnification conversion function by further using the high-magnification offset parameter.

19. An apparatus for analyzing an image, the apparatus comprising:

a communication circuit; and a processor operatively connected to the communication circuit, wherein the processor is configured to:

acquire a defect reaction image and a pattern image acquired by imaging a semiconductor device;

detect an image coordinate of a defect position in the defect reaction image;

generate a golden image of the semiconductor device based on a plurality of pattern images;

generate a design layout image corresponding to the plurality of pattern images, based on a design layout of the semiconductor device;

generate relationship information between a pattern image of the plurality of pattern images and the design layout image based on the pattern image, the golden image, and the design layout image; and extract a design layout image coordinate corresponding to the defect position from the design layout image using the image coordinate of the defect position in the defect reaction image and the generated relationship information.

20. The apparatus of claim 19, wherein the defect reaction image is an image acquired by an image acquisition apparatus optically imaging a response to an electric signal applied to the semiconductor device, and the pattern image is an image acquired by the image acquisition apparatus optically imaging a structure of the semiconductor device.

* * * * *